United States Patent
Suzuki et al.

(10) Patent No.: US 9,082,699 B2
(45) Date of Patent: Jul. 14, 2015

(54) METHOD OF MANUFACTURING A SEMICONDUCTOR DEVICE

(71) Applicant: CANON KABUSHIKI KAISHA, Tokyo (JP)

(72) Inventors: Nobuyuki Suzuki, Oita (JP); Tomohiro Migita, Ebina (JP); Satoshi Suzuki, Fujisawa (JP); Masanobu Ohmura, Yokohama (JP); Takatoshi Nakahara, Oita (JP); Keiichi Sasaki, Oita (JP)

(73) Assignee: Canon Kabushiki Kaisha, Tokyo (JP)

( * ) Notice: Subject to any disclaimer, the term of this patent is extended or adjusted under 35 U.S.C. 154(b) by 147 days.

(21) Appl. No.: 13/889,507

(22) Filed: May 8, 2013

(65) Prior Publication Data

US 2013/0316523 A1    Nov. 28, 2013

(30) Foreign Application Priority Data

May 28, 2012  (JP) ................ 2012-121386
Apr. 16, 2013  (JP) ................ 2013-086061

(51) Int. Cl.
*H01L 21/266* (2006.01)
*H01L 29/78* (2006.01)
*B41J 2/00* (2006.01)

(52) U.S. Cl.
CPC .............. *H01L 21/266* (2013.01); *B41J 2/00* (2013.01); *H01L 29/7816* (2013.01)

(58) Field of Classification Search
CPC .......... H01L 21/266; H01L 21/823493; H01L 21/823892; H01L 27/0928; B41J 2/1603

USPC ....................... 438/527; 347/84, 85
See application file for complete search history.

(56) References Cited

U.S. PATENT DOCUMENTS

| 5,739,058 A * | 4/1998 | Karniewicz et al. .......... 438/217 |
| 8,409,452 B2 | 4/2013 | Sasaki et al. |
| 2001/0041461 A1* | 11/2001 | Ridley et al. .................. 438/787 |
| 2013/0168828 A1 | 7/2013 | Sasaki et al. |

FOREIGN PATENT DOCUMENTS

JP    2006-190743 A    7/2006

* cited by examiner

*Primary Examiner* — Matthew Reames
*Assistant Examiner* — John Bodnar
(74) *Attorney, Agent, or Firm* — Fitzpatrick, Cella, Harper & Scinto (57) ABSTRACT

A method of manufacturing a semiconductor device having a twin well structure is provided. The method includes ion-implanting of a first conductivity type impurity in a first region and a second region of a semiconductor substrate, the first and second regions being located adjacent to each other; forming a first resist pattern to cover the first region of the semiconductor substrate and to expose the second region of the semiconductor substrate; ion-implanting of a second conductivity type impurity at a higher concentration compared to the first conductivity type impurity in the second region of the semiconductor substrate, with the first resist pattern being used as a mask; and thermal-diffusing the first conductivity type of impurity and the second conductivity type of impurity.

12 Claims, 7 Drawing Sheets

METHOD OF MANUFACTURING A SEMICONDUCTOR DEVICE

BACKGROUND OF THE INVENTION

1. Field of the Invention

The present invention relates to a method of manufacturing a semiconductor device.

2. Description of the Related Art

A twin-well structure in which a P-well and an N-well are located adjacent to each other is used to form an N-type transistor and a P-type transistor on the same semiconductor substrate. It is desirable not to have a step at a boundary of the P-well and the N-well in order to improve the performance of a circuit element such as an LDMOS (Lateral Diffusion Metal Oxide Silicon) transistor and the like that are formed in the twin-well structure. The Japanese Patent Laid-Open No. 2006-190743 proposes a method of manufacturing a semiconductor device that does not have a step at the boundary of the N-well and the P-well. In this manufacturing method, after a phosphorous glass layer is formed on a semiconductor substrate, an opening is made in the phosphorous glass, and a P-type impurity layer is formed by an ion implanting a p-type impurity through the opening. Then, an N-type impurity layer is formed by having phosphorus contained in the phosphorous glass diffused into the semiconductor substrate by performing an annealing. The P-well and the N-well are then formed in the semiconductor substrate by performing drive-in diffusion of the P-type impurity layer and the N-type impurity layer.

SUMMARY OF THE INVENTION

By the method disclosed in the Japanese Patent Laid-Open No. 2006-190743, as the N-type diffusion layer is formed by diffusing the phosphorous contained in the phosphorous glass, it is difficult to control an impurity concentration in the N-well, so the control of the characteristics of a transistor is made difficult. Thus, one aspect of the present invention provides a technique to make it easier to control an impurity concentration of an N-well and a P-well, with a reduction in a step height at a boundary of the N-well and the P-well.

An aspect of embodiments provides a method of manufacturing a semiconductor device having a twin well structure, comprising: ion-implanting of a first conductivity type impurity in a first region and a second region of a semiconductor substrate, the first and second regions being located adjacent to each other; forming a first resist pattern to cover the first region of the semiconductor substrate and to expose the second region of the semiconductor substrate; ion-implanting of a second conductivity type impurity at a higher concentration compared to the first conductivity type impurity in the second region of the semiconductor substrate, with the first resist pattern being used as a mask; and thermal-diffusing the first conductivity type of impurity and the second conductivity type of impurity.

Further features of the present invention will become apparent from the following description of exemplary embodiments (with reference to the attached drawings).

BRIEF DESCRIPTION OF THE DRAWINGS

The accompanying drawings, which are incorporated in and constitute a part of the specification, illustrate embodiments of the invention, and together with the description, serve to explain the principles of the invention.

FIGS. 1A-2D are schematic diagrams explaining an example of a manufacturing method of a semiconductor device according to an embodiment of the present invention.

FIGS. 4A-6B are schematic diagrams explaining another example of a manufacturing method of a semiconductor device according to an embodiment of the present invention.

DESCRIPTION OF THE EMBODIMENTS

Exemplary embodiments of the present invention will be described in detail with reference to the accompanying drawings. Note that in the various embodiments, identical or corresponding elements are given the same reference numerals in the drawings, and descriptions thereof will not be repeated. Also a modification and a combination of each embodiment are possible, if appropriate. In the following, an embodiment of the present invention will be described in the context of a manufacturing method of a semiconductor device that has an LDMOS transistor in a twin well structure that is formed in a self aligning manner. However, the present invention is also applied to any semiconductor devices that have a twin well structure. The twin well structure described in the specification refers to a structure having two well regions (semiconductor regions) with different polarity to each other, and includes a structure that has three or more well regions like a triple well structure and the like.

Referring to FIGS. 1A to 1D and FIGS. 2A to 2D, an example of a method of manufacturing a semiconductor device having an N-type LDMOS transistor will be explained, according to an embodiment of the present invention. FIGS. 1A to 1D and FIGS. 2A to 2D illustrate a cross section of a part of the semiconductor device following a manufacturing process. First, using the FIG. 2D, a structure of a semiconductor device 100 manufactured by the manufacturing method will be explained. The semiconductor device 100 has a semiconductor substrate 101, in which an N-well 108 is formed in a first region 101a of the semiconductor substrate 101, and a P-well 109 is formed in a second region 101b. The first region 101a and the second region 101b are located adjacent to each other, and the N-well 108 and the P-well 109 are similarly located adjacent to each other. A boundary between the first region 101a and the second region 101b coincides with a boundary between the N-well 108 and the P-well 109. A gate oxide film 115 is located covering the boundary of the N-well 108 and the P-well 109, and a polysilicon gate 116 is placed thereon. The N-well 108 has an N+ drain region 117, and the P-well 109 has an N+ source region 118. The N-well 108 further has a field oxide film 112 between the N+ drain region 117 and the polysilicon gate 116. A portion of the N-well 108 covered by the gate oxide film 115 functions as a drain field reducing layer, and a portion of the P-well 109 covered by the gate oxide film 115 functions as a channel layer. Also, a P-type diffusion layer 114 functioning as a channel stopper is placed under the field oxide layer of the P-well 109.

In the semiconductor device 100 of the embodiment of the invention, a surface of the N-well 108 and a surface of the P-well 109 are formed in the same plane, and there is no step at the boundary between N-well 108 and the P-well 109. Accordingly, the reliability of the gate oxide film 115 is improved, and an increase of an on-state current and an increase of off-state breakdown voltage are made possible.

Figure 1A:
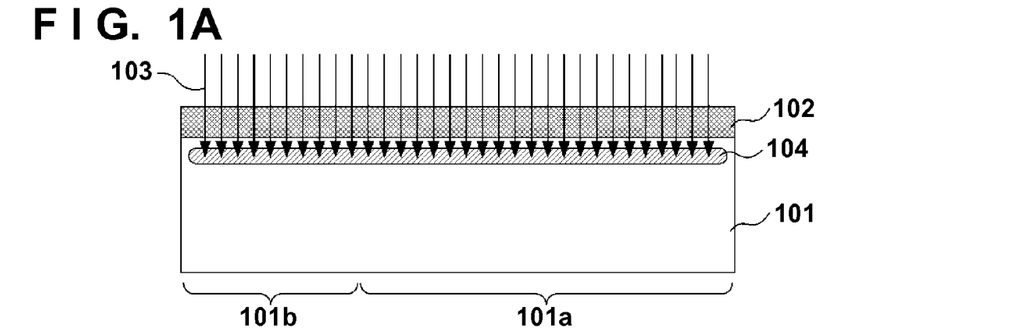

Next, a manufacturing method of the semiconductor device 100 will be explained. First, as shown in FIG. 1A, a silicon oxide film 102 is formed on the semiconductor substrate 101 composed of silicon or the like (oxide layer forming process). By ion-implanting an N-type impurity 103 (first conductivity type impurity) to the first region 101a and the second region 101b of the semiconductor substrate 101 through the silicon oxide film 102, an N-type impurity layer 104 is formed in the semiconductor substrate 101 (first implantation process). The thickness of the silicon oxide film 102 is, for example, 100 nm. As the N-type impurity 103, for example, phosphorous is implanted at a dose of $5e12$ $cm^{-2}$.

Figure 1B:
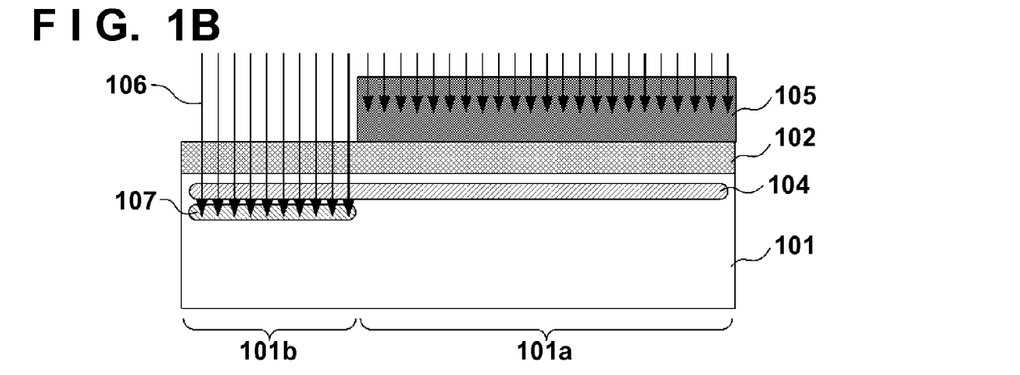

Then, as shown in FIG. 1B, a resist is coated on the silicon oxide film 102 and patterned to form a resist pattern 105 (first resist pattern) (first resist pattern formation process). The resist pattern 105 covers the first region 101a of the semiconductor substrate 101, and exposes the second region 101b of the semiconductor substrate 101. Then, by ion-implanting a P-type impurity 106 (second conductivity type impurity) to the second region 101b of the semiconductor substrate 101 using the resist pattern 105 as a mask, a P-type impurity layer 107 is formed in the semiconductor substrate 101 (second ion implantation process). As the P-type impurity 106, for example, boron is implanted at a dose of $1e13$ $cm^{-2}$. The P-type impurity 106 irradiated to the first region 101a of the semiconductor substrate 101 does not reach the semiconductor substrate 101 since it is blocked by the resist pattern 105. On the other hand, the P-type impurity 106 irradiated to the second region 101b of the semiconductor substrate 101, reaches the semiconductor substrate 101 through an opening of the resist pattern 105, and forms a P-type impurity layer 107. In the diagram, for the sake of explanation, the P-type impurity layer 107 is located at a deeper position from the surface of the semiconductor substrate 101 compared to the N-type impurity layer 104. These impurity layers can be formed at the same depth, or the P-type impurity layer 107 can be shallower. In order to form a P-well at the second region 101b of the semiconductor substrate 101, a higher concentration of the P-type impurity 106 is used compared to that of the N-type impurity 103. For example, the concentration of the P-type impurity 106 is set to be more than double the concentration of the N-type impurity 103.

Figure 1C:
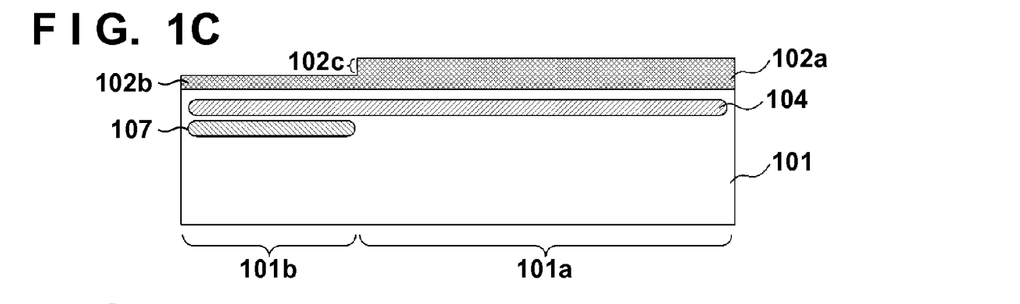

Next, as shown in FIG. 1C, a part of the silicon oxide film 102 is removed by etching, using the resist pattern 105 as a mask, then the resist pattern 105 is removed. In the following explanation, of the silicon oxide film 102 after the etching, a portion positioned above the first region 101a of the semiconductor substrate 101 is referred to as a first portion 102a, and a portion positioned above the second region 101b of the semiconductor substrate 101 is referred to as a second portion 102b. Since the thickness of the second portion 102b is thinner than that of the first portion 102a, a step 102c is formed in the silicon oxide film 102. Since the silicon oxide film 102 is etched using the resist pattern 105 that covers the first region 101a of the semiconductor substrate 101 and exposes the second region 101b, the step 102c is located just above the boundary between the first region 101a and the second region 101b. As described above, the boundary between the first region 101a and the second region 101b coincides with the boundary between the N-well 108 and the P-well 109. The step 102c may be used as an alignment mark when photolithography is performed in the following process steps. Also, utilizing the difference in the thickness of the first portion 102a and the second portion 102b of the silicon oxide film 102, the silicon oxide film 102 may be used as a mask for ion implantation in the following process.

As shown in FIG. 1C, only an upper portion or the entire portion of the silicon oxide film 102 covering the second region 101b of the semiconductor substrate 101 may be removed by etching. Even in the case of removing the entire portion, the step of the silicon oxide film 102 located just above the boundary between the first region 101a and the second region 101b can be utilized as stated above. Also, in the case of removing only the upper portion and leaving the second portion 102b of the silicon oxide film 102, the second portion 102b can function as a protection layer when ion implantation is performed in the second portion 101b of the semiconductor substrate 101. In order for the second portion 102b to function as the protection layer, the thickness of the second portion 102b may be thicker than or equal to 100 nm. Also, the first portion 102a and the second portion 102b of the silicon oxide film 102 may have a function to reduce any stress in the semiconductor substrate 101, when a field oxidation is performed in the following process.

Figure 1D:
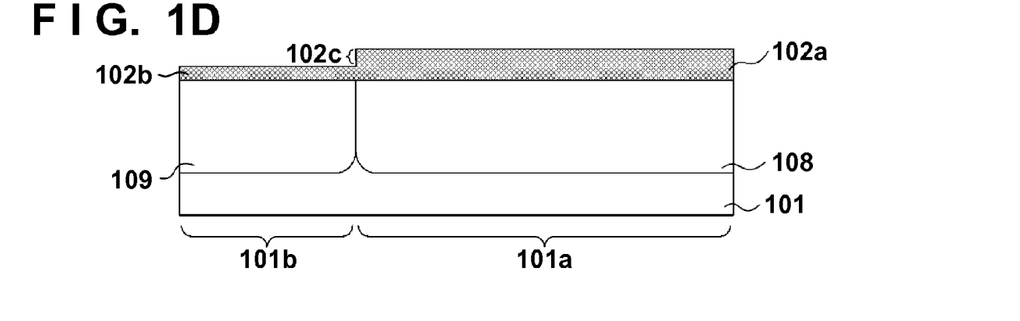

Next, shown in FIG. 1D, a drive-in diffusion (thermal diffusion) of the N-type impurity layer 104 and the P-type impurity layer 107 is performed on the semiconductor substrate 101, by high temperature diffusion at, for example, 1100° C. for 180 minutes in an electric furnace. By this operation, the N-well 108 is formed in the first portion 101a of the semiconductor substrate 101. Also, in the second region 101b of the semiconductor substrate 101, as the concentration of the P-type impurity is higher than that of the N-type impurity, the P-well 109 is formed in this region. As the N-type impurity layer 104 is formed in both the first region 101a and the second region 101b of the semiconductor substrate 101, and the P-type impurity layer 107 is formed in only the second region 101b, the boundary between the N-well 108 and the P-well 109 is formed in a self aligning manner. When the entire portion of the silicon oxide film 102 covering the second region 101b of the semiconductor substrate 101 is removed in the etching process explained in FIG. 10, a silicon thermal oxide film can be formed on the second region 101b in the thermal diffusion process. The silicon thermal oxide film may be used as the second portion 102b of the silicon oxide film 102.

Figure 2A:
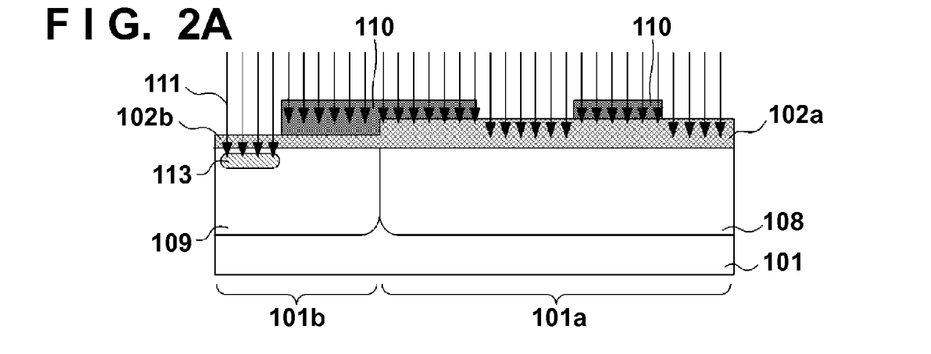

Next, as shown in FIG. 2A, a resist pattern 110 (second resist pattern) composed of a silicon nitride film covering a portion which will become an active region is formed. Then, ion implantation is performed by irradiating a P-type impurity 111 towards the semiconductor substrate 101, and after that the resist pattern 110 is removed. For example boron is implanted at a dose of $1e14$ $cm^{-2}$. The P-type impurity 111 does not reach the semiconductor substrate 101 at the portion that is covered by the resist pattern 110 and later becomes the active region, because the resist pattern acts as a mask. Also, among exposed portions of the resist pattern 110, the P-type impurity 111 does not reach the semiconductor substrate 101 at a portion covered by the first portion 102a of the silicon oxide film 102, because the silicon oxide film acts as a mask. On the other hand, among the exposed portions of the resist pattern 110, the P-type impurity 111 reaches the semiconductor substrate 101 through the silicon oxide film 102 at a portion covered by the second portion 102b of the silicon oxide film 102, and a P-type impurity layer 113 is formed. In this way, as the silicon oxide film 102 with the step 102c acts as a mask, there is no need to further perform a lithography process when ion implantation to the P-well 109 is performed.

Figure 2B:
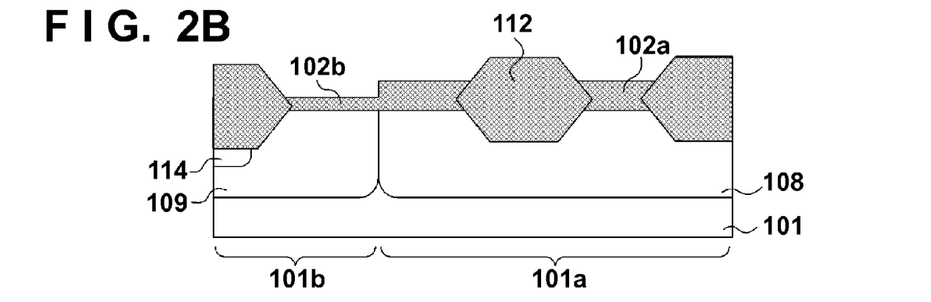

Next, as shown in FIG. 2B, a field oxide film 112 having a thickness of about 700 nm is selectively grown by, for example, hydrogen burning oxidization. In this oxidization, the P-type impurity layer 113 is diffused to form a P-type diffusion layer 114. After this, in addition, an impurity may be ion-implanted to adjust a threshold voltage of a transistor. Here, as the first portion 102a of the silicon oxide film 102 acts as a mask, the impurity is selectively implanted only in the P-well 109 and only the surface concentration of the P-well can be controlled.

Figure 2C:
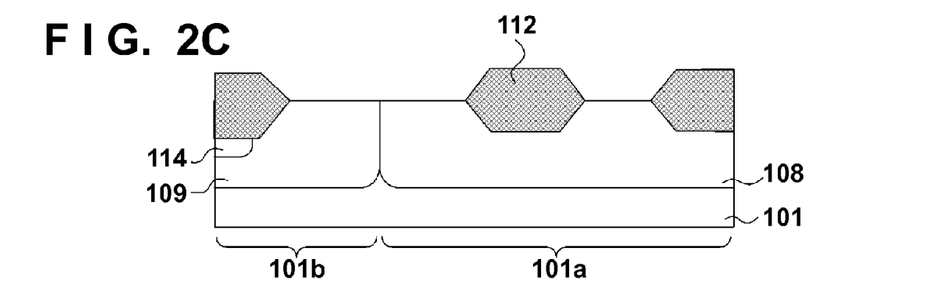
Figure 2D:
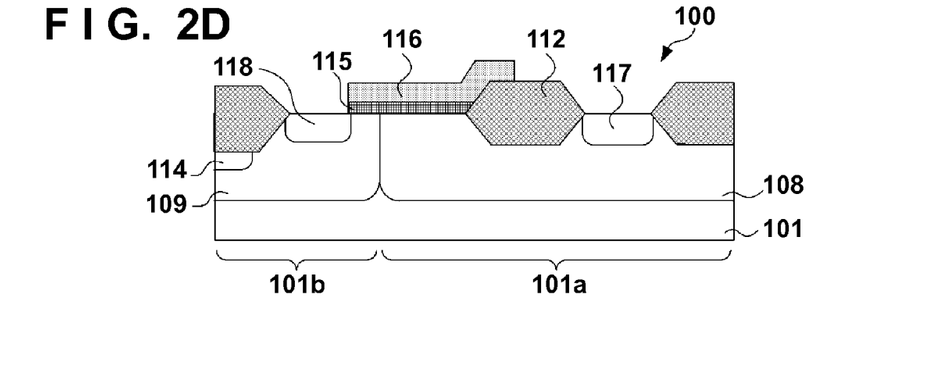

Next, as shown in FIG. 2C, the first portion 102a and the second portion 102b of the silicon oxide film 102 are removed by, for example, an approximately 10 wt % fluoride solution. And the surfaces of the N-well 108 and the P-well 109 are exposed at the active region.

Finally, as shown in FIG. 2D, a gate oxide film 115 with a thickness of about 10 nm is formed at a position covering the boundary between the N-well 108 and the P-well 109, and a polysilicon gate 116 is formed thereon. Then, an N+ drain region 117 and an N+ source region 118 are formed by ion-implanting, for example, arsenic at a dose of 5e15 $cm^{-2}$, using the polysilicon gate 116 and the field oxide film 112 as a mask. After that, by performing other existing process steps if necessary, the semiconductor device 100 is completed.

In the manufacturing method of the semiconductor device according to the embodiment of the present invention described above, as both the P-well and the N-well are formed by the ion implantation, it is easy to control the impurity concentration of each of the wells so that they have desirable concentrations. Also, in the embodiment described above, although the formation method of the N-type LDMOS transistor is explained, a P-type LDMOS transistor can also be formed by reversing the polarity of each of the impurities in ion implantation processes.

Figure 3:
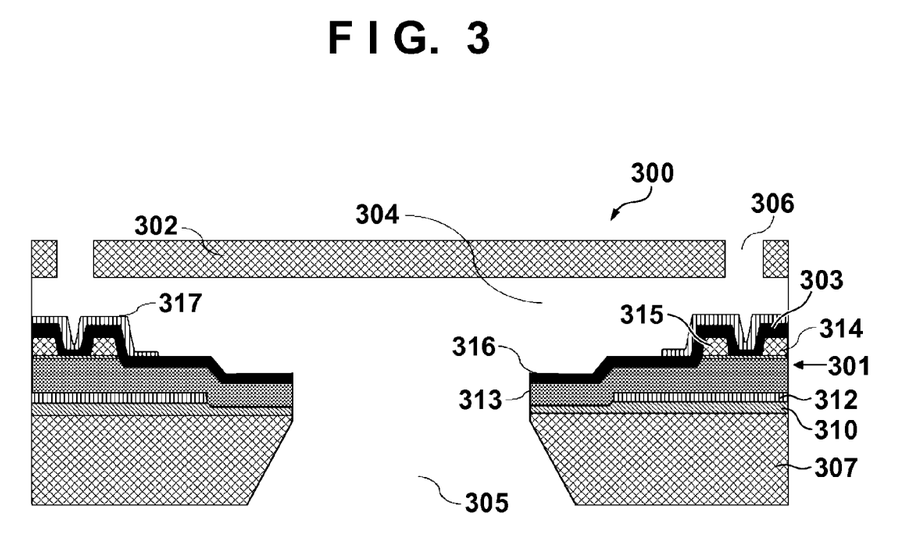
FIG. 3 is a schematic diagram explaining an example of a structure of another semiconductor device according to an embodiment of the present invention.

Next, an example of a method of manufacturing a semiconductor device which has an ink supply port passing through a semiconductor substrate will be described, according to another embodiment of the present invention. With reference to FIG. 3, a structure of a semiconductor device 300 manufactured by this manufacturing method will be described. In the semiconductor device 300, a resin substrate 302 is stacked on a semiconductor substrate 301, a plurality of heaters 303 are fabricated inside the semiconductor substrate 301, and a flow passage 304 is formed between the semiconductor substrate 301 and the resin substrate 302. And also, each heater 303 is respectively located inside each flow passage 304. The semiconductor device 300 is further comprised with an ink supply port 305 which is in communication with each flow passage 304, and a plurality of orifices 306 which are respectively provided for each flow passage 304. The ink supply port 305 passes through the semiconductor substrate 301. The plurality of orifices 306 pass through the resin substrate 302.

On the semiconductor substrate 301, at one side of principal surfaces (upper side of the surfaces) of a silicon substrate 307, an LDMOS transistor (not shown) is formed on a twin well structure formed in a self aligning manner, by the method of manufacturing a semiconductor according to the embodiment. And also, a field oxide film 310 and a first interlayer insulating film 312 composed of, for example, phosphorous glass are formed. Thereon, a first metal wiring layer (not shown) to connect electrically to a MOS transistor, and a heater 314 and a second metal wiring layer 315 are stacked via a second interlayer insulating film 313 composed of, for example, a silicon oxide film. And also, a silicon nitride film 316 functioning as a passivation film, and a tantalum film 317 for anti-cavitation are formed. Meanwhile, the resin substrate 302 composed of a nozzle material is provided with the orifice 306, and the flow passage 304 is formed between the semiconductor substrate 301 and the resin substrate 302. At the other side of the principal surfaces of the semiconductor substrate 301 (lower side of the surfaces), the ink supply port 305 passing through the silicon substrate 307 is formed by anisotropic etching using a strong alkali solution such as TMAH aqueous solution as an etching solution.

Figure 4A:
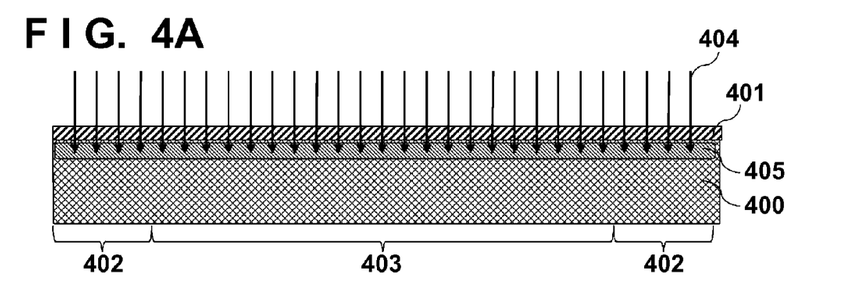

Hereafter, a method of manufacturing the semiconductor device 300 will be described, referring to FIGS. 4A to 6B. As shown in FIG. 4A, a silicon oxide film 401 is formed on a silicon substrate 400. An N-type impurity layer 405 is formed in the silicon substrate 400, by ion-implanting an N-type impurity 404 (first conductivity type impurity) to the first region 402 and the second region 403 (ink supply port forming region) of the silicon substrate 400 through the silicon oxide film 401 (first implantation process). The thickness of the silicon oxide film 401 is, for example, 100 nm. The concentration of the N-type impurity 404 is determined by the characteristics of a transistor which drives the semiconductor device 300. For example, phosphorus is implanted at a dose of 5e12 $cm^{-2}$.

Figure 4B:
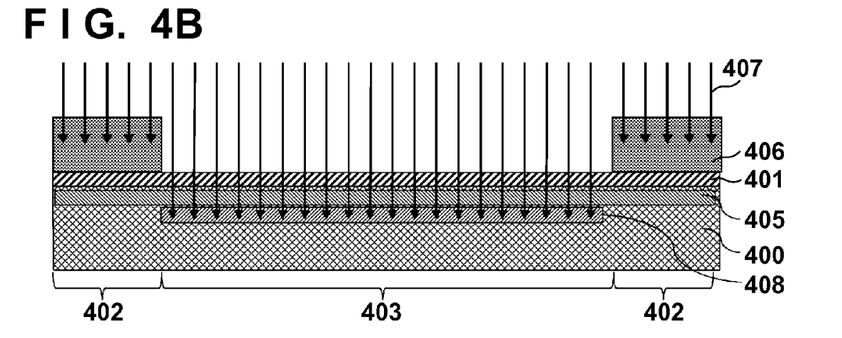

Next, as shown in FIG. 4B, a resist pattern 406 (first resist pattern) is formed by coating a resist on the silicon oxide film 401 and patterning it (resist pattern forming process). The resist pattern 406 covers the first region 402 of the silicon substrate 400, and exposes the second region 403. Then, a P-type impurity layer 408 is formed in the silicon substrate 400, by ion-implanting a P-type impurity 407 (second conductivity type impurity) to the second region 403 of the silicon substrate 400 using the resist pattern 406 as a mask (second ion implantation process). As the P-type impurity 407, for example, boron is implanted at a dose of 1e13 $cm^{-2}$. The P-type impurity 407 irradiated to the first region 402 of the silicon substrate 400 does not reach the silicon substrate 400 since it is blocked by the resist pattern 406. On the other hand, the P-type impurity 407 irradiated to the second region 403 of the silicon substrate 400 reaches the silicon substrate 400 through an opening of the resist pattern 406, and forms the P-type impurity layer 408. In the diagram, for the sake of explanation, the P-type impurity layer 408 is located at a deeper position from the surface of the silicon substrate 400 compared to the N-type impurity layer 405. These impurity layers can be formed at the same depth, or the P-type impurity layer 408 can be shallower. In order to form a P-well at the second region 403 of the silicon substrate 400, a higher concentration of the P-type impurity 407 is used compared to that of the N-type impurity 404. For example, the concentration of the P-type impurity 407 is set to be more than double the concentration of the N-type impurity 404.

Figure 7:
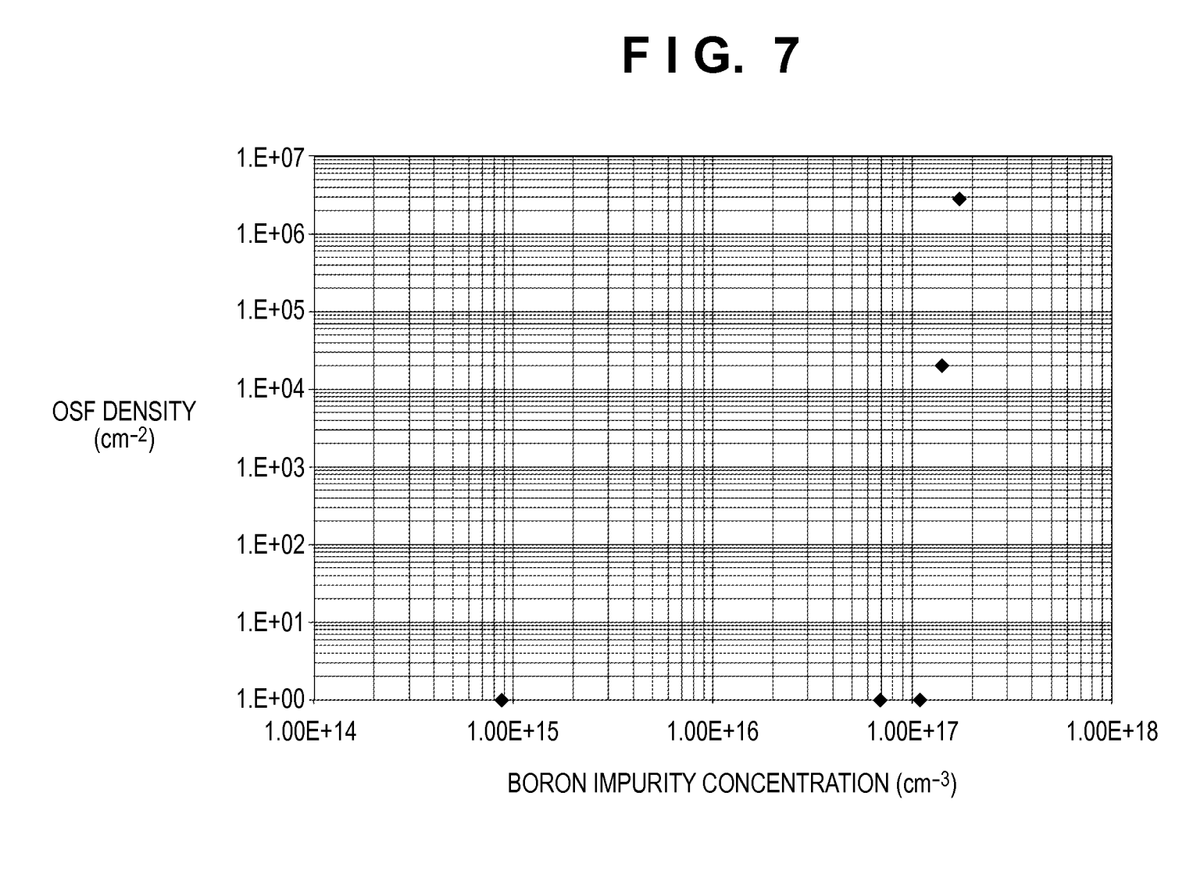
FIG. 7 is a diagram showing the relationship between a boron concentration in a substrate and a density of OSF.

The concentration of the P-type impurity 407 is determined by a characteristics of a MOS transistor which drives the semiconductor device 300. In the case of forming the P-type impurity layer 408 at the second region 403 (ink supply port forming region) using boron as the P-type impurity 407, the boron is implanted at the dose amount of 3e12 $cm^{-2}$, and phosphorous is implanted at a dose of 1.5e12 $cm^{-2}$ as the N-type impurity 404, for example. An impurity concentration of the silicon substrate 400 may be not greater than 1e17 $cm^{-3}$, because, as the boron concentration in the silicon substrate 400 increases, a large quantity of OSF (oxidation induced stacking fault) is induced in the subsequent process of forming a field oxide film. Due to the increase of the OSF, anisotropic etching proceeds rapidly, which makes it difficult to control the dimensions of the ink supply port 305 in the subsequent process of forming the ink supply port 305. FIG. 7 shows a relationship between the boron concentration in the silicon substrate and the OSF density in the silicon substrate after the formation process of the field oxide film. The OSF density increases rapidly when the boron concentration in the silicon substrate exceeds 1e17 $cm^{-3}$. A boron atom has an effect of facilitating the formation of an oxide segregation material that acts as a growth nucleus for the formation of the OSF, thus causing an increase in the OSF density. Especially, boron in a silicon lattice contributes to the increase of the OSF density, because it performs the role of forming the oxide segregation material. On the other hand, as an N-type impurity such as phosphorous, arsenide and the like does not have an effect of facilitating the formation of the oxide segregation material, the OSF does not increase. Therefore, in the process shown in FIG. 4B, an N-well may be formed by covering the second region 403 with the resist pattern 406, and not implanting a boron impurity into the second region 403 of the silicon substrate 400. After that, although not shown in the figures, an upper portion or the entire portion of the silicon oxide film 401 covering the second region 403 of the silicon substrate 400 is removed by etching.

Figure 4C:
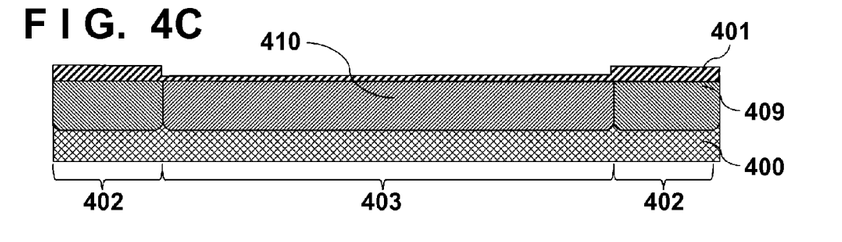

Next, as shown in FIG. 4C, a drive-in diffusion (thermal diffusion) of the N-type impurity layer 405 and the P-type impurity layer 408 is performed for the silicon substrate 400, by a high temperature diffusion at, for example, 1100° C. for 180 minutes in an electric furnace. By this operation, the N-well 409 is formed in the first region 402 of the silicon substrate 400. Also, in the second region 403 of the silicon substrate 400, as the concentration of the P-type impurity is higher than that of the N-type impurity, the P-well 410 is formed in this region.

Figure 4D:
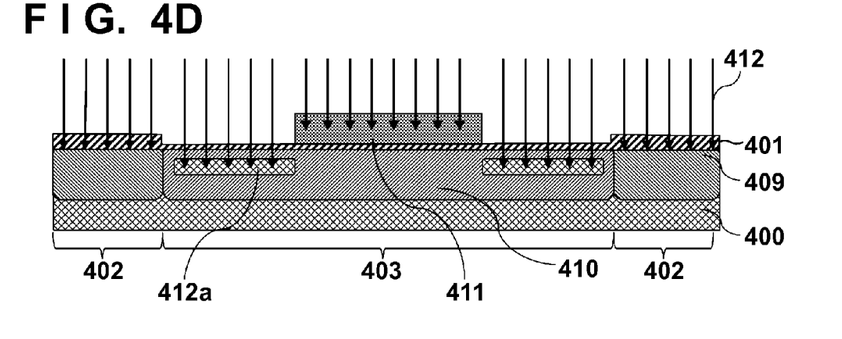

Next, as shown in FIG. 4D, a resist pattern 411 (second resist pattern) composed of a silicon nitride film covering a portion which will become an active region is formed. Then, ion implantation is performed by irradiating a P-type impurity 412 towards the silicon substrate 400, and after that the resist pattern 411 is removed. The P-type impurity 412 does not reach the silicon substrate 400 at the portion that is covered by the resist pattern 411 and later becomes the active region, because the resist pattern 411 acts as a mask. Also, among exposed portions of the resist pattern 411, the P-type impurity 412 does not reach the silicon substrate 400 at a portion covered by the first region 402 of the silicon oxide film 401, because the silicon oxide acts as a mask. On the other hand, among the exposed portions of the resist pattern 411, the P-type impurity 412 reaches the silicon substrate 400 through the silicon oxide film 401 at a portion covered by the second region 403 of the silicon oxide film 401, and a P-type impurity layer 412a is formed. The impurity concentration of the P-type impurity layer 412a is determined by a threshold voltage of a parasitic transistor on a field oxide film, which is required by a semiconductor device 300. When an impurity at the P-type impurity layer 412a is boron, because of the above reason, the concentration of the P-type impurity layer 412a and the concentration of the P-well 410 are adjusted so that the concentration of the boron in the silicon substrate 400 at the second region 403 (ink supply port forming region) is not greater than 1e17 cm$^{-3}$.

Figure 5A:
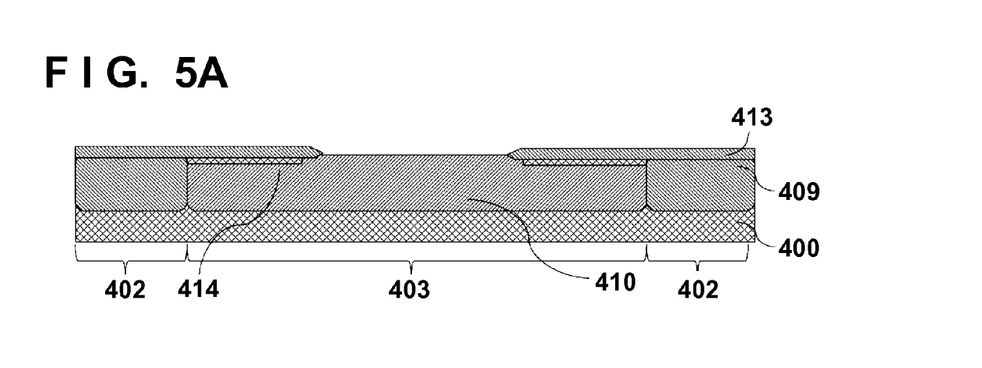

Next, as shown in FIG. 5A, a field oxide film 413 with a thickness of about 700 nm is selectively formed by, for example, hydrogen burning oxidization. By this oxidization, the P-type impurity layer 412a is diffused to form a P-type diffusion layer 414. Also, high temperature annealing in a non-oxidizing atmosphere may be performed before the formation of the field oxide film 413. For example, annealing at 1000° C. for 60 minutes is performed in a nitrogen atmosphere. By performing high temperature annealing in the non-oxidizing atmosphere, it becomes possible to annihilate the boron in the silicon lattice that is facilitating the increase of the OSF density, so that the increase of the OSF density is suppressed. After that, a MOS transistor constituting a drive circuit of the semiconductor device is formed by forming a diffusion layer and a gate electrode at an active area.

Figure 5B:
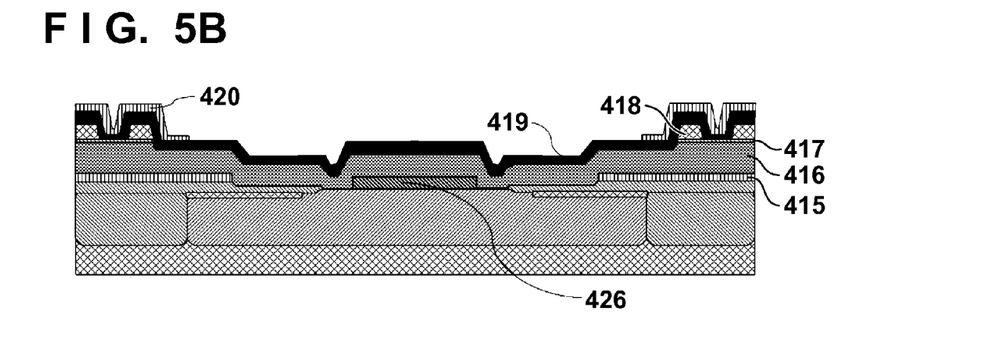
Figure 5C:
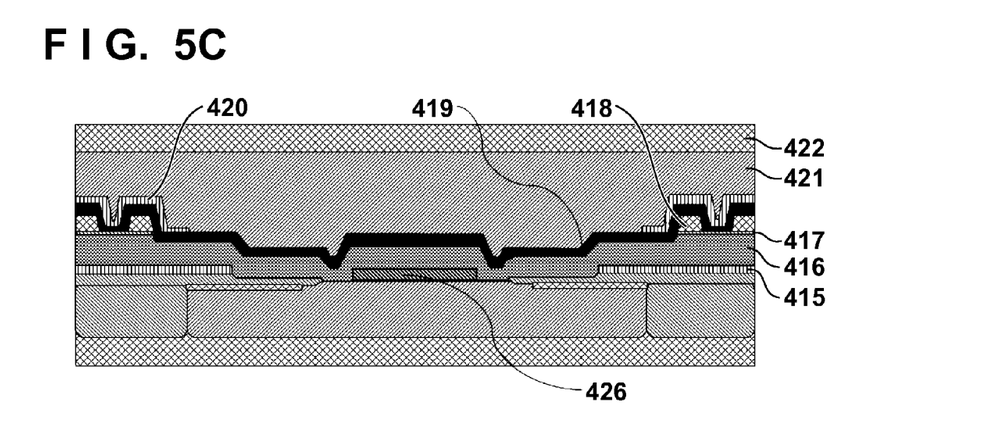

Next, as shown in FIG. 5B, a first wiring layer (not shown) composed by, for example, aluminum or the like, and a first interlayer insulation film 415 composed of, for example, a phosphorous glass, are formed to have an electric interconnection of a MOS transistor. A part of the first wiring layer can function as a sacrifice layer 426. This sacrifice layer 426 is for forming the ink supply port 423 with high dimensional accuracy. After that, a second interlayer insulating film 416 composed of a silicon oxide film is formed, a heating resistance 417 (heating material) and a second wiring layer 418 composed of, for example, aluminum or the like are formed, a silicon nitride film 419 of the thickness in the range of about 250 to 800 nm acting as a passivation film of a semiconductor is formed, and a tantalum film 420 of the thickness of in the range of about 50 to 600 nm acting as an anti-cavitation layer is formed in the region of the heating resistance (heating material) 417. Next, as shown in FIG. 5C, a resin substrate constituted by a nozzle mold material 421 and a nozzle material 422 is stacked to form the orifice and the flow passage.

Figure 6A:
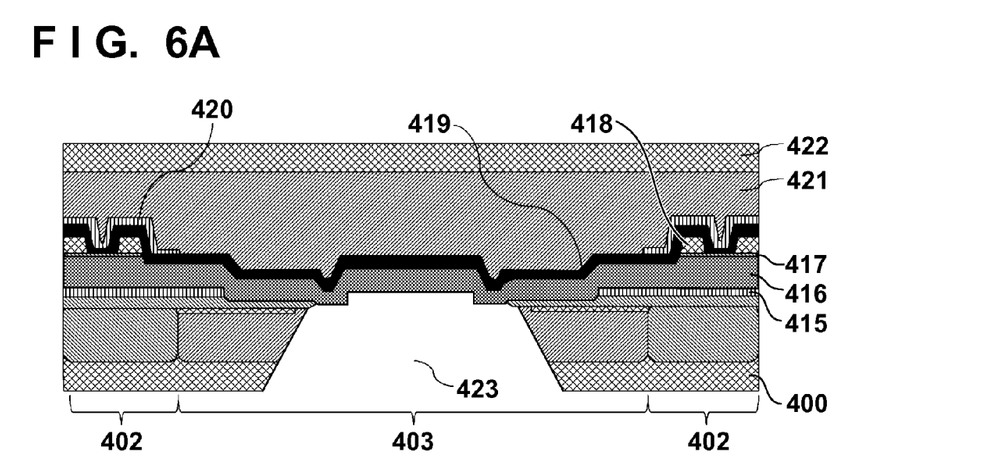

Next, as shown in FIG. 6A, patterning is performed on a back side of the silicon substrate 400, and the ink supply port 423 passing through the semiconductor substrate is formed, by performing anisotropic etching from the back side of the silicon substrate 400 using a TMAH solution as an etching solution. The sacrifice layer 426 is also etched at this time. As the sacrifice layer 426 is acting as a reference for forming the ink supply port 423, the high accuracy ink supply port 423 is formed. By making the boron impurity concentration in the second region 403 (ink supply port forming region) not greater than 1e17 cm$^{-3}$, control of the dimensions of the ink supply port 423 is facilitated, as generation of the OSF (oxidation induced stacking fault) is suppressed.

Figure 6B:
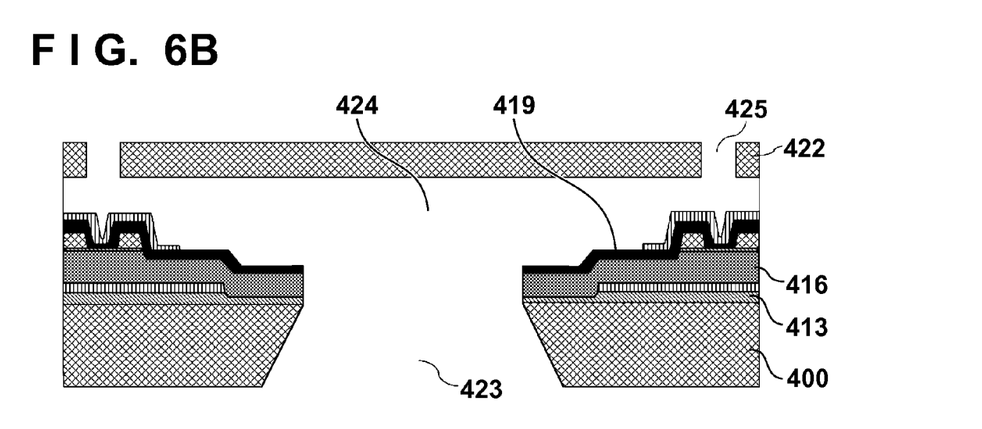

Next, as shown in FIG. 6B, the second interlayer insulating film 416 (silicon oxide film) inside the ink supply port 423 and a redundant portion of the field oxide film 413 extending inside the ink supply port 423 are removed simultaneously by wet etching using a buffered hydrofluoric acid, and the silicon nitride film 419 is removed by a dry etching using a gas of a fluorine system or an oxide system. After that, the nozzle mold material 421 is removed using a solvent, and the orifice 425 in communication with the flow passage 424 of an ink is formed in the nozzle material 422. In this manner, the semiconductor device 300 having an ink supply port 423 passing through the semiconductor substrate is completed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-121386, filed May 28, 2012, and No. 2013-086061, filed Apr. 16, 2013, which are hereby incorporated by reference herein in their entirety.

What is claimed is:
1. A method of manufacturing a semiconductor device having a twin well structure, comprising:
ion-implanting a first conductivity type impurity in a first region and a second region of a semiconductor substrate, the first and second regions being located adjacent to each other;
forming a first mask pattern to cover the first region of the semiconductor substrate and to expose the second region of the semiconductor substrate;

ion-implanting a second conductivity type impurity at a higher concentration compared to the first conductivity type impurity in the second region of the semiconductor substrate, using the first mask pattern as a mask;

thermal-diffusing the first conductivity type of impurity and the second conductivity type of impurity; and forming an ink supply port passing through the second region of the semiconductor substrate.

2. The method according to claim 1, further comprising:

forming a silicon oxide film having a first portion on the first region of the semiconductor substrate and a second portion on the second region of the semiconductor substrate, the second portion having a smaller thickness than that of the first portion;

forming a second mask pattern on the silicon oxide film exposing a part of the first portion and a part of the second portion of the silicon oxide film;

ion-implanting an impurity in a part of the second region of the semiconductor substrate, using the first part of the silicon oxide film and the second mask pattern as a mask;

forming a field oxide film by selectively causing the film at the portion of the silicon oxide film exposed from the second mask pattern to grow.

3. The method according to claim 2, wherein the forming of the silicon oxide film comprises:

forming a silicon oxide film on the first region and the second region of the semiconductor substrate before the forming of the first mask pattern; and forming the second portion of the silicon oxide film, after forming the first mask pattern, by removing an upper portion of the silicon oxide film covering the second region, using the first mask pattern as a mask.

4. The method according to claim 2, wherein the forming of the silicon oxide layer comprises:

forming a silicon oxide film on the first region and the second region of the semiconductor substrate before the forming of the first mask pattern;

removing the portion of the silicon oxide film covering the second region, after forming the first mask pattern, using the first mask pattern as a mask; and forming the second portion of the silicon oxide by thermal-oxidizing the second region of the semiconductor substrate by the thermal-diffusion.

5. The method according to claim 1, wherein a concentration of the second conductivity type impurity is more than double a concentration of the first conductivity type impurity.

6. The method according to claim 1, further comprising performing annealing of the semiconductor substrate in a non-oxidizing atmosphere.

7. A method of manufacturing a semiconductor device having a twin well structure, comprising:

ion-implanting a first conductivity type impurity in a first region and a second region of a semiconductor substrate, the first and second regions being located adjacent to each other;

forming a first mask pattern to cover the first region of the semiconductor substrate and to expose the second region of the semiconductor substrate;

ion-implanting a second conductivity type impurity at a higher concentration compared to the first conductivity type impurity in the second region of the semiconductor substrate, using the first mask pattern as a mask;

thermal-diffusing the first conductivity type of impurity and the second conductivity type of impurity;

forming a silicon oxide film having a first portion on the first region of the semiconductor substrate and a second portion on the second region of the semiconductor substrate, the second portion having a smaller thickness than that of the first portion;

forming a second mask pattern on the silicon oxide film exposing a part of the second portion of the silicon oxide film; and ion-implanting an impurity in a part of the second region of the semiconductor substrate, using the first part of the silicon oxide film and the second mask pattern as a mask, wherein the forming of the silicon oxide film comprises:

forming a silicon oxide film on the first region and the second region of the semiconductor substrate before the forming of the first mask pattern; and forming the second portion of the silicon oxide film, after forming the first mask pattern, by removing an upper portion of the silicon oxide film covering the second region, using the first mask pattern as a mask.

8. The method according to claim 7, further comprising forming a field oxide film by selectively causing the film at the portion of the silicon oxide film exposed from the second mask pattern to grow.

9. A method of manufacturing a semiconductor device having a twin well structure, comprising:

ion-implanting a first conductivity type impurity in a first region and a second region of a semiconductor substrate, the first and second regions being located adjacent to each other;

forming a first mask pattern to cover the first region of the semiconductor substrate and to expose the second region of the semiconductor substrate;

ion-implanting a second conductivity type impurity at a higher concentration compared to the first conductivity type impurity in the second region of the semiconductor substrate, using the first mask pattern as a mask;

thermal-diffusing the first conductivity type of impurity and the second conductivity type of impurity;

forming a silicon oxide film having a first portion on the first region of the semiconductor substrate and a second portion on the second region of the semiconductor substrate, the second portion having a smaller thickness than that of the first portion;

forming a second mask pattern on the silicon oxide film exposing a part of the second portion of the silicon oxide film; and ion-implanting an impurity in a part of the second region of the semiconductor substrate, using the first part of the silicon oxide film and the second mask pattern as a mask, wherein the forming of the silicon oxide film comprises:

forming a silicon oxide film on the first region and the second region of the semiconductor substrate before the forming of the first mask pattern;

removing the portion of the silicon oxide film covering the second region, after forming the first mask pattern, using the first mask pattern as a mask; and forming the second portion of the silicon oxide by thermal-oxidizing the second region of the semiconductor substrate by the thermal-diffusion.

10. The method according to claim 9, further comprising forming a field oxide film by selectively causing the film at the portion of the silicon oxide film exposed from the second mask pattern to grow.

11. The method according to claim 9, wherein a concentration of the second conductivity type impurity is more than double a concentration of the first conductivity type impurity.

12. The method according to claim 9, further comprising performing annealing of the semiconductor substrate in a non-oxidizing atmosphere.

* * * * *